(12) United States Patent
Rousseau et al.

(10) Patent No.: US 7,902,837 B2
(45) Date of Patent: Mar. 8, 2011

(54) ALIGNMENT METHOD OF TWO SUBSTRATES BY MICROCOILS

(75) Inventors: Maxime Rousseau, Grenoble (FR); Bernard Viala, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 267 days.

(21) Appl. No.: 12/320,879

(22) Filed: Feb. 6, 2009

(65) Prior Publication Data

US 2009/0215207 A1 Aug. 27, 2009

(30) Foreign Application Priority Data

Feb. 22, 2008 (FR) ...................................... 08 00957

(51) Int. Cl.
*G01R 27/26* (2006.01)
*G01R 33/02* (2006.01)
*G01C 9/00* (2006.01)

(52) U.S. Cl. ........................ 324/654; 324/245; 702/150

(58) Field of Classification Search .................. 324/654, 324/649, 600, 245, 246, 555, 758; 702/117, 702/116, 108, 189, 183, 127, 150, 151, 94, 95; 73/314, 1.79; 340/686.1, 524

See application file for complete search history.

(56) References Cited

U.S. PATENT DOCUMENTS

| 4,371,116 | A  | * | 2/1983 | Sage et al. ................... 239/731 |
| 6,911,664 | B2 | * | 6/2005 | Il'ichev et al. .................. 257/31 |
| 7,027,160 | B2 | * | 4/2006 | Sperling ....................... 356/446 |
| 7,084,534 | B2 | * | 8/2006 | Ohishi ........................ 310/12.04 |
| 7,193,423 | B1 |   | 3/2007 | Dalton et al. |
| 2002/0110936 | A1 |   | 8/2002 | Wada et al. |
| 2004/0033025 | A1 | * | 2/2004 | Richard et al. .................. 385/49 |
| 2007/0178612 | A1 |   | 8/2007 | Bradl et al. |

FOREIGN PATENT DOCUMENTS

| DE | 10 2006 001 601 A1 | 7/2007 |
| EP | 0 439 136 A2 | 7/1991 |

* cited by examiner

*Primary Examiner* — Hoai-An D Nguyen
(74) *Attorney, Agent, or Firm* — Oliff & Berridge, PLC

(57) ABSTRACT

Substrates to be aligned include microcoils arranged at the level of their facing surfaces. In an alignment phase, power is supplied to at least the microcoils of the first substrate, whereas the inductance of the microcoils of the second substrate is measured. The microcoils are preferably flat microcoils in the form of a spiral or a serpentine.

12 Claims, 3 Drawing Sheets

ALIGNMENT METHOD OF TWO SUBSTRATES BY MICROCOILS

BACKGROUND OF THE INVENTION

The invention relates to an alignment method between first and second substrates having facing surfaces comprising alignment detection means, a method comprising, in an alignment phase, displacement of the substrates with respect to one another in a plane parallel to the substrates, measuring of an electrical quantity associated with the alignment detection means and determination of the alignment according to the variations of said quantity.

STATE OF THE ART

Three-dimensional integration represents a new integration scheme in which several levels of active components are stacked on one another thus forming a multi-level chip. From a practical standpoint, three-dimensional integration consists in bringing two substrates having complementary integrated circuits to face one another and in bonding them together to form a single chip. However, the main problem involves alignment of the two integrated circuits so that the active components of each of the substrates can communicate.

To achieve this type of integration, "one-on-one" substrate alignment techniques, mainly used in the microsystems field for example for electro-mechanical microsystems, provide numerous advantages.

However, to perform integration of three-dimensional type that couples two integrated circuits having a high active component density, for example CMOS transistors, a high-precision alignment system is required.

Alignment of two substrates is mostly achieved by means of optic techniques. In a general manner, alignment marks are formed on each of the substrates. An optic reading head then determines the coordinates of the marks on each of the substrates. Alignment of the substrates is then performed by aligning the marks with one another. In conventional manner, a misalignment of about 1 µm is obtained under optimal performance conditions, which limits the interest of three-dimensional integration in particular in terms of the inter-level interconnection density.

A capacitive method has been developed, in particular in U.S. Pat. No. 7,193,423, to replace the optic technique and achieve better alignment precisions. A capacitive coupling structure is then integrated on each of the substrates, just below an oxide layer serving the purpose of molecular bonding. The two substrates are then placed in direct physical contact and a capacitor formed by the capacitive coupling structures of the two substrates separated by the silicon oxide is then formed. Displacement of the substrates with respect to one another then results in a variation of the capacitance value of the capacitor which can then be used for performing alignment. A capacitance variation of at least $10^{-18}$ F has to be obtained for a movement of one nanometer.

Numerous drawbacks greatly reduce the interest presented by this technique. Indeed, formation of the capacitor means that the two layers of silicon oxide are in direct physical contact. In practice, a molecular bonding interface is already formed giving rise to the creation of weak bonds, and displacement of the substrates with respect to one another in the alignment phase is liable to result in formation of defects in the bonding interface, which reduces the reliability of the bonding and of the circuit obtained. Moreover, alignment of the substrates is linked to measurement of the capacitance value which is itself dependent on the distance separating the two electrodes of the capacitor. If the thickness of the oxide layer varies, the capacitance value also varies. If the oxide layer does not present a constant thickness, it is therefore difficult to perform reliable and industrially usable alignment.

OBJECT OF THE INVENTION

The object of the invention is to provide an alignment method of two substrates that is easy to implement, that presents a great alignment precision and that is compatible with conventional fabrication methods.

The method according to the invention is characterized in that the alignment detection means comprise microcoils at the level of the facing surfaces of the first and second substrates, and that the method comprises at least power supply of the microcoils of the first substrate and measurement of the inductance of the microcoils of the second substrate, said inductance constituting said electrical quantity.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF A PREFERRED EMBODIMENT OF THE INVENTION

Figure 1:
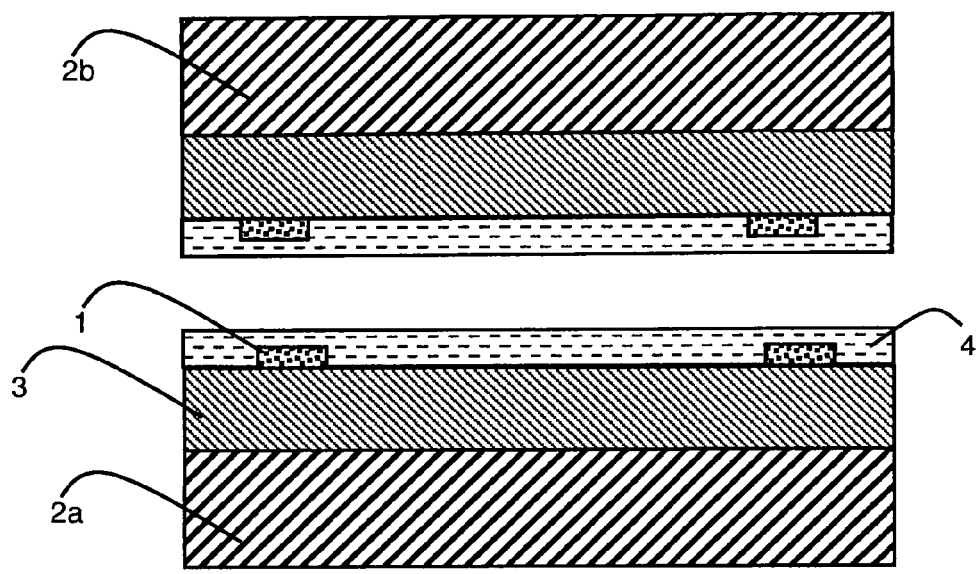
FIG. 1 schematically represents, in cross section, two facing substrates each comprising alignment measuring means the according to the invention.

According to the invention, the alignment detection means 1 are of inductive type and are formed at the level of the surfaces of the substrates 2 to be aligned, the surface of the substrates 2 are facing one another, as illustrated very schematically in FIG. 1. Each substrate 2 can comprise active components, for example transistors, metallic interconnection levels 3 connecting the different active components to one another. The inductive-type alignment detection means are formed by microcoils 1 of solenoid or flat type. As microcoils 1 of solenoid type are more complicated to produce and costly, flat microcoils 1 are preferred.

Microcoils 1 are advantageously formed in the metallic interconnection levels and preferably in the last metallic interconnection level, the level the farthest from substrate 2. Microcoils 1 are made after metallic interconnection levels 3 have been fabricated. They are preferably covered by a layer of dielectric material 4, formed for example by a polymer material, a mineral material, silicon nitride, or advantageously silicon oxide, designed for molecular bonding. Layer 4 typically has a thickness of about 200 nm once flattened.

Figure 2:
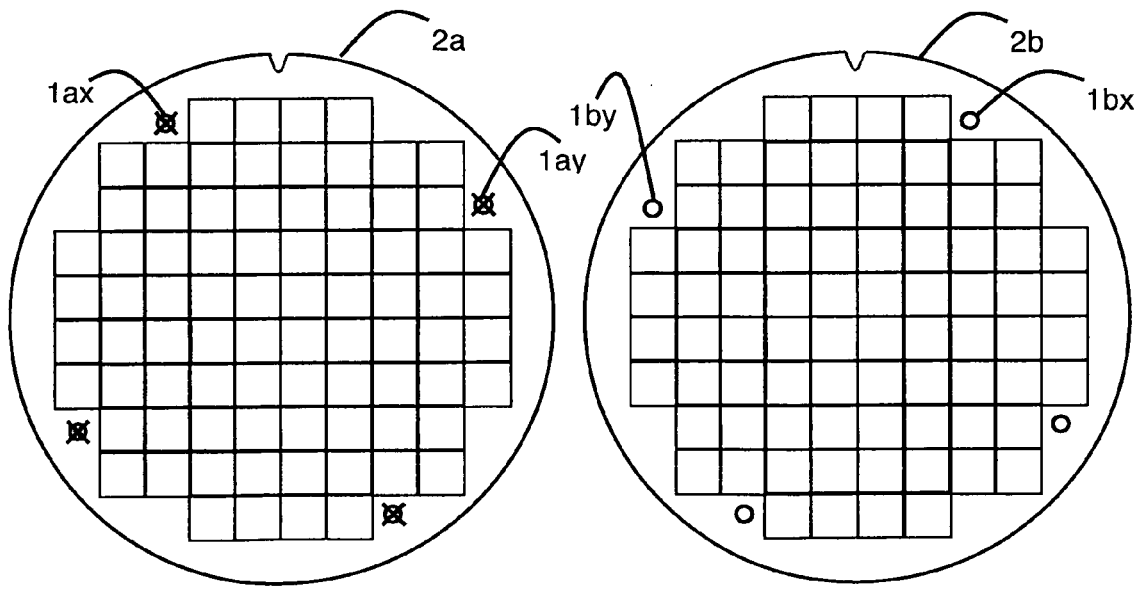
FIG. 2 illustrates a particular arrangement of the microcoils, FIGS. 3 to 5 schematically represent embodiments of microcoils in top view, FIG. 6 schematically represents the direction of the current and the resulting field lines corresponding to a cross section along the line X of a microcoil according to FIG. 5, FIGS. 7 and 8 schematically represent respectively 5 misalignment positions of two facing microcoils and measurement of the corresponding inductance variation.

As illustrated in FIG. 2, microcoils 1 are preferably arranged at the periphery of substrate 2. They are connected to electrical contact pads (not shown) via connecting lines. The contact pads perform power supply of microcoils 1 and/or enable the global inductance of the latter to be measured by means of an external processing circuit (not shown).

Figure 3:
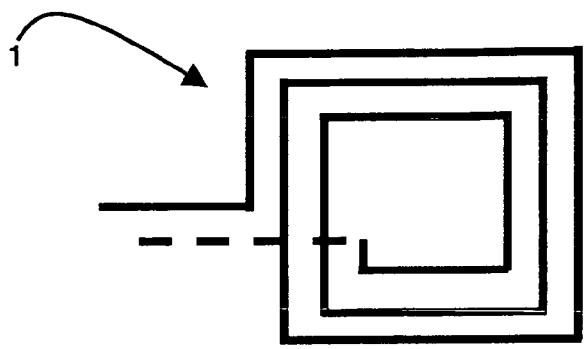
Figure 4:
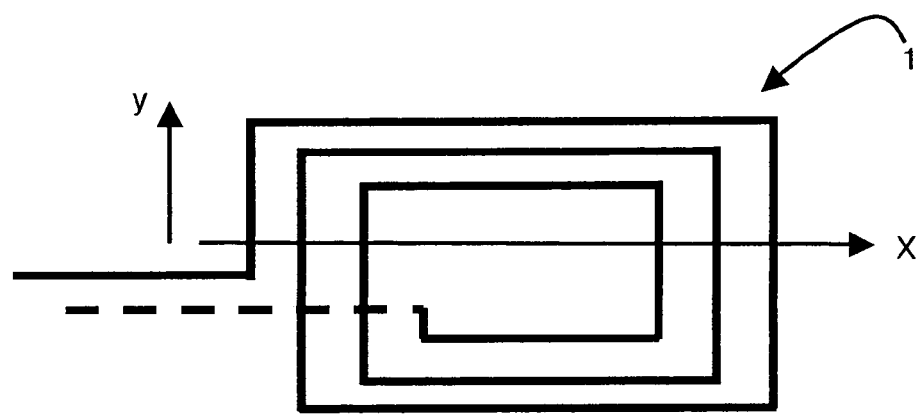
Figure 5:
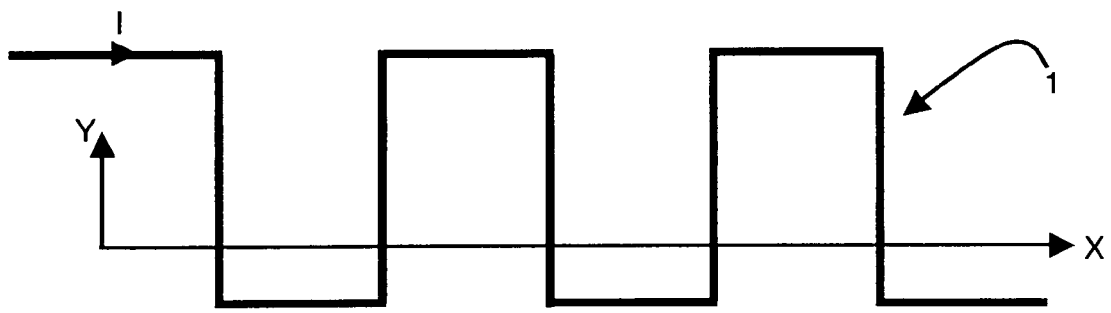

As illustrated in FIGS. 3 to 5, different types of flat microcoils 1 are able to be used. The flat microcoils can for example be microcoils in the shape of a spiral, either square (FIG. 3) or elongate (FIG. 4). Such square spiral flat microcoils 1 are commonly used in the microsystems and microelectronics field. Production of microcoils 1 of square spiral form (FIG. 3) is very well mastered. The coil is formed on the last metallic interconnection level. However, one of the connection lines (dashed line in FIG. 3) is achieved on a lower interconnection level. Design has to be integrated on two consecutive metal levels. The dimensions of this type of coil are dependent on the number of turns the latter comprises. This type of coil has fairly dispersive field lines which provide a fairly extensive field of interaction compared with the internal diameter of microcoil 1. The precision obtained for alignment is consequently limited and may be insufficient.

A more precise alignment can be obtained in a direction perpendicular to the elongation direction of a flat microcoil 1 in the form of an elongate spiral (FIG. 4), i.e. along an axis (Y) perpendicular to the main axis of the coil (axis X in FIG. 4) of rectangular shape. To obtain satisfactory alignment of the two substrates 2, alignment is preferably performed in two successive steps. A first alignment is performed along an axis Y with microcoils having a main axis along X. Alignment is then performed along X with microcoils perpendicular to the previous ones, i.e. with a main axis along Y. For elongate spiral flat microcoils, movement and alignment of one substrate 2 with respect to the other are therefore performed successively along axes perpendicular to the main axes of microcoils 1.

Another type of flat microcoil 1 in the form of a serpentine, illustrated in FIG. 5, is advantageously used. These microcoils are no longer spiral-shaped but in the form of a serpentine. The field lines induced by this type of coil have the particularity of not looping back on themselves but of interacting in one and the same direction, i.e. the main axis of the microcoil, i.e. in the direction X in FIG. 5. This type of microcoil 1 enables a better precision to be obtained than that obtained with spiral coils. As before, for optimal precision, serpentine flat microcoils 1 are oriented in two preferably perpendicular directions and alignment is performed in two successive steps. However, for microcoils in the form of a serpentine, movement and alignment of one substrate 2 with respect to the other are performed successively along axes parallel to the main axes of microcoils 1.

The major advantage of serpentine flat coils is that they present a much simpler production method from a technological point of view than solenoid coils, and even than square or elongate spiral flat coils. In the case of serpentine coils, only one metal level is in fact required for fabrication as against two levels for square spirals and many more for solenoids. A location simply has to be set aside for the microcoils in the circuit design stage and fabrication of the latter is performed at the same time as the last metal level of the circuit. Furthermore, the materials used in the microcoils are conventional microelectronics materials. The microcoils are therefore made from copper and are insulated by a conventional dielectric, which eliminates compatibility problems of the materials and possible extra costs.

Advantageously, each substrate comprises at least two flat microcoils 1 with main axes oriented in different directions. Even more advantageously, each substrate comprises two series of microcoils, each microcoil of a series having its main axis oriented in the same predefined direction, the directions of the two series not being parallel. Although alignment is simpler when the main axes of the different series of microcoils 1 are perpendicular, it can be envisaged to use non-perpendicular main axes. Alignment of the two substrates with respect to one another in a plane parallel to the substrates is then achieved. This alignment can be performed directly or advantageously in two steps. A first displacement and a first alignment are performed with a first series of microcoils 1 oriented along a first main axis. Then a second series of microcoils 1 elongate along a second main axis is used to perform a second displacement of the substrates with respect to one another. The use of dissociated first and second displacements is particularly advantageous to finalize alignment of the substrates if the main axes are perpendicular. Alignment along the second axis does not in fact modify the alignment already performed along the first main axis. In this way, by displacing substrates 2 with respect to one another in directions parallel to the main axes of the microcoils, the substrates can be aligned with very great precision. In this way, the morphological specificities of each of the coils enable the misalignments of substrates 2 to be successively reduced in two directions.

In general manner, microcoils 1 are arranged on the surfaces of substrates 2a and 2b in such a way that two microcoils presenting substantially parallel main axes are facing one another when alignment takes place. In a preferred embodiment illustrated in FIG. 2, microcoils 1 are arranged at the periphery of substrates 2. Advantageously, at least two microcoils 1x or 1y presenting the same main direction are arranged symmetrically with respect to the center of the substrate. In FIG. 2, two series of microcoils 1x and 1y are each formed by two microcoils arranged symmetrically with respect to the center of each of substrates 2a and 2b and to the periphery of the latter. This arrangement of the microcoils is particularly advantageous to increase the alignment precision. In this way, when the surfaces of substrates 2a and 2b comprising the microcoils are brought to face one another, microcoils 1ax, respectively 1ay, are substantially facing microcoils 1bx, respectively 1by. The alignment method can then be initiated.

Microcoils 1 are conventionally made in the last metallic interconnection level in the form of copper lines having a typical cross section of about $100 \times 100$ nm$^2$. The minimum spacing between two copper lines is about 100 nm. Typically the microcoils have maximum dimensions of a few microns, for example $5 \times 5$ µm$^2$ with a distance between turns of about 5 µm. The surface occupied by a microcoil 1 is typically less than 900 µm$^2$. In conventional manner, the number of turns of microcoils 1 is a minimum of two and preferably equal to five. Typically, the microcoils being made in the last metallic interconnection level, their thickness is predefined. However, if the thickness is incompatible with the required inductive performances, a specific additional level can be fabricated for formation of the microcoils.

In a first embodiment of the alignment method, only microcoils 1 of one of substrates 2 are supplied by an alternating current. Alignment of the substrates is then performed by measuring the inductance variation in microcoils 1 of the other substrate which are not supplied. An inductance variation around a zero value is measured since these microcoils are not supplied.

In a second embodiment, microcoils 1 of the two substrates 2 are supplied by two alternating currents, preferably of the same frequency, with a zero phase difference and of the same amplitude. Microcoils 1 are supplied in such a way that the currents flowing through the two microcoils are directed in the same direction. The field lines induced by each of the coils are in this way directed in the same direction. An optimal interaction is then obtained when the two microcoils 1 are perfectly aligned, i.e. when the two substrates are perfectly aligned.

Figure 6:
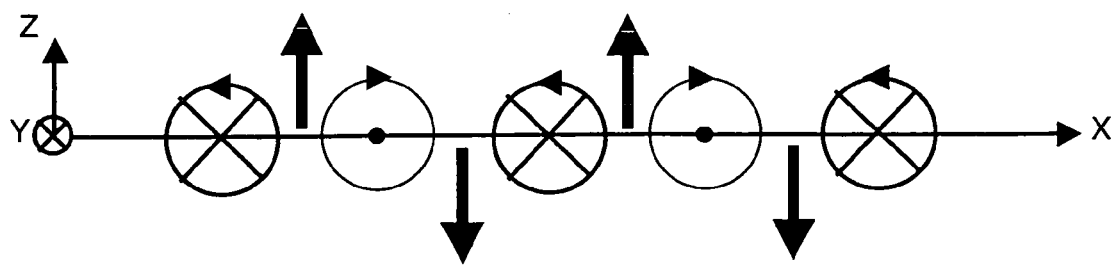

When a current flows in a microcoil 1, induced field lines are created around the metal wire forming the coil. The orientation of the field lines depends on the direction of the current flowing through microcoil 1. FIG. 6 illustrates the current direction, in the direction y, of the induced field lines of a microcoil 1 in the form of a serpentine according to FIG. 4 seen in cross section along axis X. The microcoil serpentines have the effect of making the current I flow in opposite directions in two adjacent portions perpendicular to axis X. Consequently, in a microcoil in the form of a serpentine, the induced field lines have opposite directions of rotation and are distributed alternately. This then results in the forces resulting from interaction of these field lines, represented in FIG. 6 by arrows parallel to axis Z, being opposite and distributed alternately.

In all cases, microcoils 1 of one of the substrates, for example bottom substrate 2a, are connected to inductance detection means, for example to a multimeter. The multimeter measures the inductance induced in the microcoil of bottom substrate 2a by the corresponding microcoil of top substrate 2b. The value of the inductance variation induced in the bottom microcoil by the top microcoil is used directly to locate the position of the substrates with relation to one another. The multimeter is conventionally connected to a processing circuit (not shown) which controls micro-positioning means. The alignment process is based on the fact that inductive coupling is at a maximum when the associated two microcoils are perfectly facing one another, i.e. they are aligned on the same vertical axis.

Figure 7:
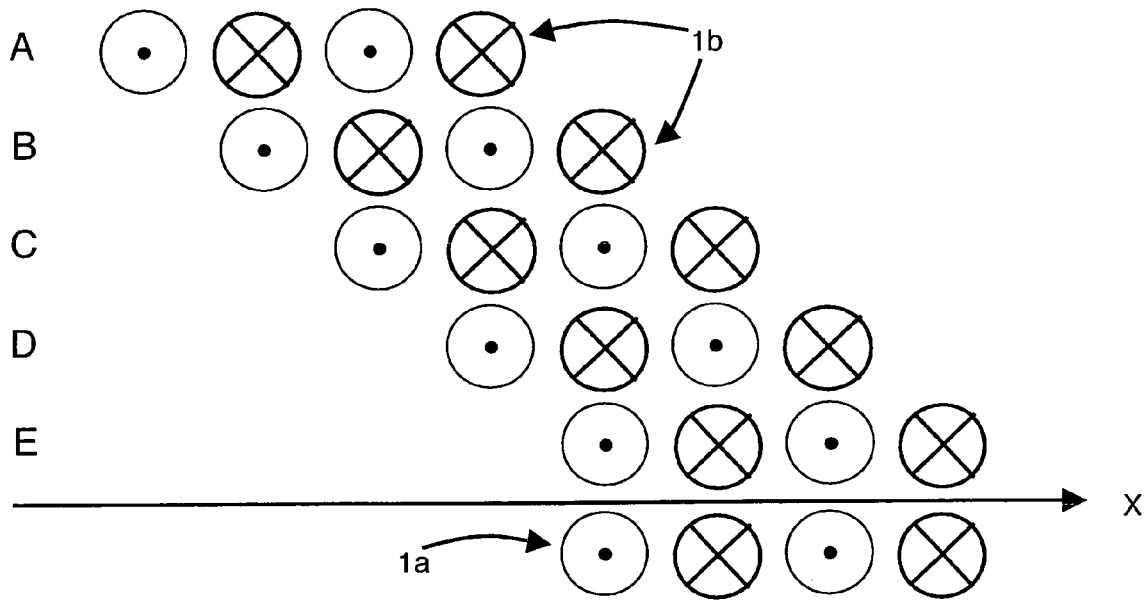
Figure 8:
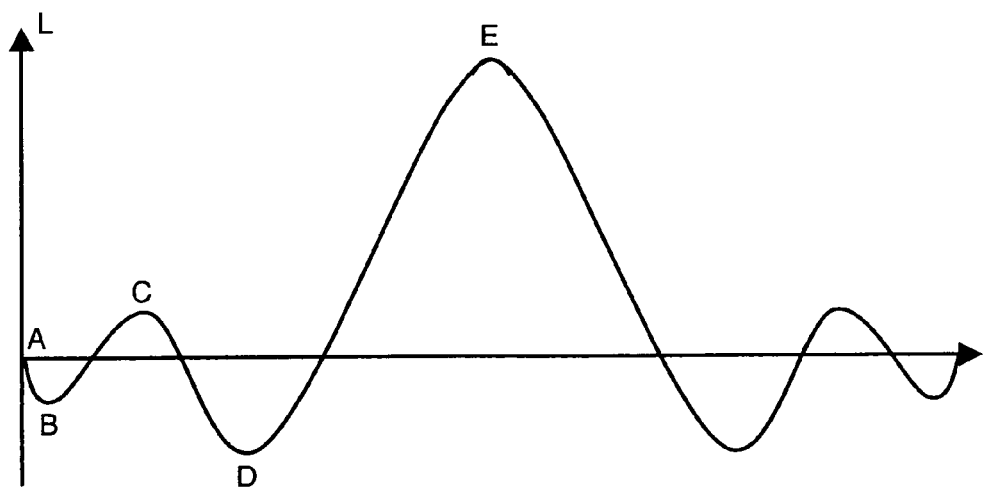

In the particular embodiment illustrated in FIGS. 6 and 7, two identical microcoils 1 in the form of a serpentine are associated and the two microcoils are supplied with electrical power so that the currents flowing through the two microcoils are directed in the same direction. A single microcoil, constituting the measuring microcoil, is used to measure the inductance variation ΔL. The two microcoils being identical, their induced fields are also identical if the current intensities flowing through the two inductive circuits are equal. In this way, the resulting forces of each of the coils are identical in their intensity and their position with respect to the turns. FIGS. 6 and 7 illustrate different positions of two microcoils with respect to one another and the inductance variation ΔL of the measuring microcoil which results from the different interactions of the resulting forces. In FIG. 7, measuring microcoil 1a, in the bottom part of the figure, does not move whereas the associated microcoil 1b is moved along the axis X and takes five different positions. The different positions illustrated go, along axis X, from total misalignment (position A) to full alignment (position E) of the two microcoils 1.

In position A, the two microcoils 1a and 1b do not overlap at all. There is then no variation of the inductance L in measuring microcoil 1a as the system is not disturbed. By reducing their misalignment, the inductance of the measuring microcoil varies. The field lines induced in the facing branches (branch the farthest to the right of microcoil 1b being moved and branch the farthest to the left of measuring microcoil 1a) being of opposite directions, the inductance variation is first of all negative. When the two microcoils reach position B in which the microcoils have a single facing field line of opposite directions, this field line is cancelled out and the global inductance measured at the terminals of the measuring microcoil reaches a first minimum. If displacement of microcoil 1b to the right is continued, the inductance increases as the interaction between the induced field lines of opposite directions decreases and is progressively replaced by an interaction between field lines of the same direction.

In position C, microcoils 1a and 1b have two facing field lines which are oriented in the same direction. The coupling system is strengthened instead of being cancelled out. In position C, the variation of the inductance L reaches a first maximum that is higher in absolute value than the maximum variation reached in position B, as two couples of field lines are then in interaction instead of a single couple.

In position D, as in position B, the inductance variation corresponds to bringing opposite field lines to face one another. However, in position D, three field lines are involved and the inductance reaches a higher minimum in absolute value than the minimum reached in position B or the maximum reached in position C. In position E in which the two microcoils 1a and 1b are perfectly aligned along the axis X, all the field lines are facing and in the same direction, which is expressed by a maximum positive variation of the inductance. The alignment method is based here on the fact that all the induced fields originating from microcoils 1a and 1b interact in constructive and not destructive manner when position E is reached.

Maximal alignment of the microcoils can then be determined. When alignment of the microcoils is maximal, the amplitude of the inductance variation is also maximal, which corresponds to a minimum misalignment between the substrates. The amplitude of the inductance variation in the measuring microcoil is independent from the direction of the current flowing in the microcoils and only depends on the alignment between the microcoils.

For example purposes, an inductance variation of 5% can be detected, i.e. comprised between 0.025 and 0.1 nH for flat microcoils in the form of a serpentine having an initial inductance comprised between 0.5 and 2 nH.

Unlike the capacitive method, alignment by the inductive method can be performed without any direct contact between the substrates. The inductance variation is in fact detectable at a distance, which means that alignment can be performed leaving a predetermined gap between the substrates during the alignment phase. In this way, generation of defects at the bonding interface is nil as there is no contact between the two substrates. Furthermore, the distance separating the two substrates is typically comprised in the range of a few microns to a few tens of microns, which alleviates constraints on a separation distance control/monitoring system. The typical distance is for example 10 μm for coils where micrometric dimensions (typically between 1 and 5 μm) and currents of a few tens of milliamps (for example 50 mA) are involved.

The invention claimed is:

1. An alignment method of first and second substrates, the first and second substrates each having a surface comprising microcoils, the surface of the first substrate comprising microcoils and facing the surface of the second substrate comprising microcoils, at least the microcoils of the first substrate being power supplied, method comprising:
    displacing the substrates with respect to one another in a plane parallel to the substrates;
    measuring the inductance of the microcoils of the second substrate; and
    determining the alignment according to the variations of said inductance.

2. The method according to claim 1, wherein alignment of the substrates is maximal when the measured inductance variation is maximal.

3. The method according to claim 1, comprising power supply of the microcoils of the two substrates.

4. The method according to claim 1, wherein the two substrates are separated by a predetermined gap during the alignment phase.

5. The method according to claim 1, wherein the microcoils are formed by flat microcoils.

6. The method according to claim 5, wherein the microcoils are of square spiral or elongate spiral type.

7. The method according to claim 5, wherein the microcoils are of serpentine type.

8. The method according to claim 1, wherein the microcoils comprising a main axis, each substrate comprises at least two series of microcoils having main axes of different orientations, each series comprising at least two microcoils arranged symmetrically with respect to the center of the substrate.

9. The method according to claim 8, wherein the microcoils being of elongate spiral type, movement and alignment of one substrate with respect to the other are performed successively along axes perpendicular to the main axes of said microcoils.

10. The method according to claim 8, wherein the microcoils being in the form of a serpentine, movement and alignment of one substrate with respect to the other are performed successively along axes parallel to the main axes of said microcoils.

11. The method according to claim 8, wherein the main axes are perpendicular.

12. The method according to claim 1, wherein the substrates comprising metallic interconnection levels, the microcoils are made in the last metallic interconnection level.

\* \* \* \* \*